United States Patent
Shibata (10) Patent No.: US 10,720,381 B2
(45) Date of Patent: Jul. 21, 2020

(54) SEMICONDUCTOR DEVICE AND METHOD OF MANUFACTURING THE SAME

(71) Applicant: Kabushiki Kaisha Toshiba, Minato-ku, Tokyo (JP)

(72) Inventor: Toyokazu Shibata, Kawasaki Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 16/567,287

(22) Filed: Sep. 11, 2019

(65) Prior Publication Data
US 2020/0006206 A1 Jan. 2, 2020

Related U.S. Application Data

(62) Division of application No. 15/698,926, filed on Sep. 8, 2017.

(30) Foreign Application Priority Data

Mar. 21, 2017 (JP) .................. 2017-054915

(51) Int. Cl.
*H01L 23/498* (2006.01)
*H01L 23/495* (2006.01)
(Continued)

(52) U.S. Cl.
CPC .... *H01L 23/49537* (2013.01); *H01L 21/4825* (2013.01); *H01L 21/4842* (2013.01);
(Continued)

(58) Field of Classification Search
CPC .............. H01L 21/4846; H01L 21/485; H01L 21/4853; H01L 23/481; H01L 23/4824;
(Continued)

(56) References Cited

U.S. PATENT DOCUMENTS 5,543,658 A 8/1996 Hosokawa et al.
5,801,439 A 9/1998 Fujisawa et al.
(Continued)

FOREIGN PATENT DOCUMENTS

JP H02-054248 B2 11/1990
JP H03-012954 A 1/1991
(Continued)

*Primary Examiner* — Jae Lee
(74) *Attorney, Agent, or Firm* — White & Case LLP (57) ABSTRACT

To reduce a package size of a semiconductor device. According to embodiments, there is a semiconductor device comprising: a first die pad; a first inner lead arranged inside a molded resin; a second die pad; and a second inner lead arranged inside the resin, wherein a part of the first inner lead and a part of the second inner lead are adhered and electrically connected to each other, a first semiconductor chip mounted on the first die pad is electrically connected to a second semiconductor chip mounted on the second die pad via the first inner lead and the second inner lead, and an end face of one end of the first inner lead and the second inner lead that are adhered to each other is exposed to a side surface of the resin.

3 Claims, 12 Drawing Sheets

(51) Int. Cl.
*H01L 23/00* (2006.01)
*H01L 23/31* (2006.01)
*H01L 21/48* (2006.01)
*H01L 21/56* (2006.01)
*H01L 23/36* (2006.01)

(52) U.S. Cl.
CPC ........ *H01L 21/565* (2013.01); *H01L 23/3114* (2013.01); *H01L 23/36* (2013.01); *H01L 23/4952* (2013.01); *H01L 23/49503* (2013.01); *H01L 23/49541* (2013.01); *H01L 23/49548* (2013.01); *H01L 23/49568* (2013.01); *H01L 23/49575* (2013.01); *H01L 23/562* (2013.01); *H01L 23/3107* (2013.01); *H01L 23/49551* (2013.01); *H01L 2224/48247* (2013.01); *H01L 2924/181* (2013.01)

(58) Field of Classification Search
CPC ............... H01L 23/495; H01L 23/4951; H01L 23/49537; H01L 23/49551; H01L 23/49555; H01L 23/49805; H01L 23/49861
See application file for complete search history.

(56) References Cited

U.S. PATENT DOCUMENTS 8,358,017 B2 * 1/2013 Tsui .................... H01L 24/40
257/778
2002/0005575 A1 1/2002 Park et al.
2013/0181333 A1 7/2013 Chou
2017/0301613 A1 * 10/2017 Lin ................ H01L 23/49562

FOREIGN PATENT DOCUMENTS

| | | |
|---|---|---|
| JP | H03-029354 A | 2/1991 |
| JP | H06-350011 A | 12/1994 |
| JP | H08-008389 A | 1/1996 |
| JP | H09-129819 A | 5/1997 |
| JP | H11-345915 A | 12/1999 |

* cited by examiner

SEMICONDUCTOR DEVICE AND METHOD OF MANUFACTURING THE SAME

CROSS-REFERENCE TO RELATED APPLICATIONS

This application is a divisional of application Ser. No. 15/698,926, filed Sep. 8, 2017 and is based upon and claims the benefit of priority from Japanese Patent Application No. 2017-54915, filed on Mar. 21, 2017; the entire contents of which are incorporated herein by reference.

FIELD

Embodiments described herein relate generally to a semiconductor device and a method of manufacturing the same.

BACKGROUND

In a SiP (System in Package), a plurality of semiconductor chips are often accommodated in one package in order to reduce a package size. In this case, semiconductor chips are often stacked. However, a package having a structure without stacking the semiconductor chips is also known.

For the package having the structure without stacking the semiconductor chips, there is known a package with an outer lead for each chip or a package with an outer lead common to the respective chips.

However, when a signal is exchanged between semiconductor chips of a conventional package, regions in which outer leads are formed are needed, resulting in an increase in package size of a semiconductor device.

DETAILED DESCRIPTION

An embodiment will be described below with reference to the accompanying drawings.

1 Arrangement

Figure 1:
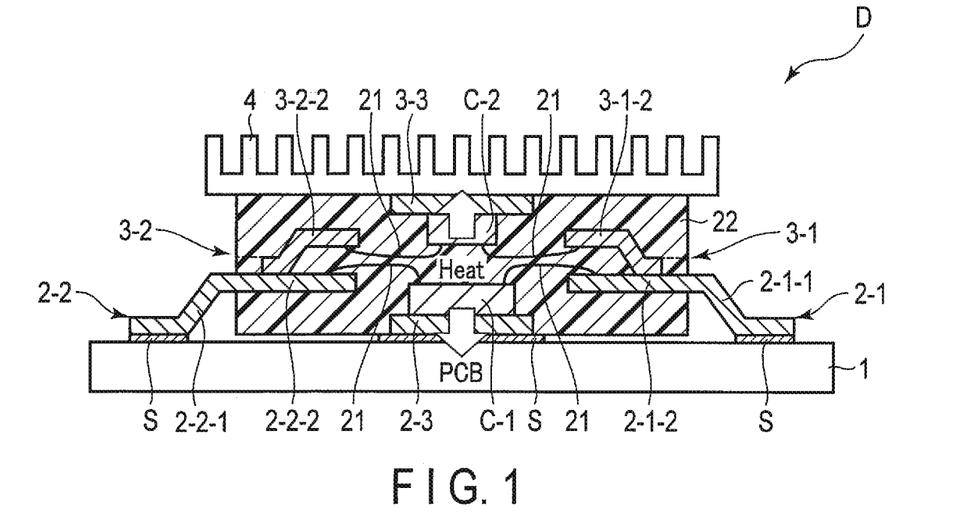
FIG. 1 is a partial sectional view of a semiconductor device D showing the relationship between leads 2-1 and 2-2 and inner leads 3-1-2 and 3-2-2 of a semiconductor device according to an embodiment.
Figure 2:
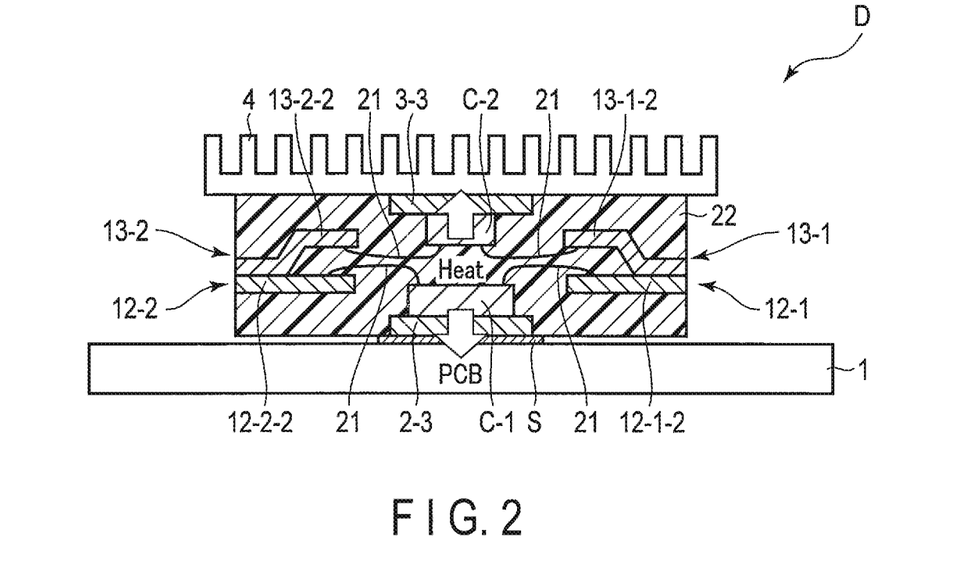
FIG. 2 is a partial sectional view of the semiconductor device D showing the relationship between inner leads 12-1-2 and 12-2-2 and inner leads 13-1-2 and 13-2-2 for inter-chip communication.

FIG. 1 is a partial sectional view of a semiconductor device D showing the relationship between leads 2-1 and 2-2 with outer leads 2-1-1 and 2-2-1, and inner leads 3-1-2 and 3-2-2 without any outer lead. FIG. 2 is a partial sectional view of the semiconductor device D showing the relationship between inner leads 12-1-2 and 12-2-2 and inner leads 13-1-2 and 13-2-2 for inter-chip communication.

A lead 3-1 in FIG. 1 includes the inner lead 3-1-2 and a tie bar (not shown) continuous with the inner lead 3-1-2. However, tie bar is cut at the time of the manufacture of the semiconductor device D to be described later. The same also applies to a lead 3-2. A lead 12-1 in FIG. 2 includes the inner lead 12-1-2 and a tie bar (not shown) continuous with the inner lead 12-1-2. However, the tie bar is cut at the time of the manufacture of the semiconductor device D to be described later. The same also applies to leads 13-1, 12-2, and 13-2.

As shown in FIGS. 1 and 2, a surface on which the wiring of a printed circuit board 1 (PCB) is formed is fixed, with solder S, to the lower surface of a first die pad 2-3 exposed from a molded resin 22.

A first semiconductor chip C-1 is mounted on the upper surface of the first die pad 2-3. This radiates heat generated in the first semiconductor chip C-1 to the printed circuit board 1 via the first die pad 2-3.

As shown in FIG. 1, the first input/output (not shown) of the first semiconductor chip C-1 is electrically connected to an inner lead 2-1-2 of the lead 2-1 by a wire 21.

In the embodiment, out of the leads, leads covered with the molded resin 22 will be referred to as "inner leads", and leads not covered with the resin 22 will be referred to as "outer leads". Further, out of the leads not covered with the resin 22, leads cut from the inner leads at the time of the manufacture of the semiconductor device D will be referred to as "tie bars".

The lead 2-1 includes the inner lead 2-1-2 and the outer lead 2-1-1 continuous with the inner lead 2-1-2.

The inner lead 2-1-2 of the lead 2-1 is formed so as to extend in the horizontal direction in the resin 22. The inner lead 3-1-2 is provided in the upper part of the inner lead 2-1-2.

The upper surface of a contact portion of the inner lead 2-1-2 contacting an inner lead 3-1-2 is adhered to the inner lead 3-1-2, so that the upper surface is brought into contact and has electrical connection with the lower surface of the contact portion of the inner lead 3-1-2.

The outer lead 2-1-1 continuous with the inner lead 2-1-2 includes, so as to be connected to the corresponding wiring of the printed circuit board 1, a tilt portion extending in the obliquely lower right direction, and a horizontal portion continuous with this tilt portion and extending in the horizontal direction on the printed circuit board 1. The horizontal portion of this outer lead 2-1-1 is connected, with the solder S, to the wiring formed on the printed circuit board 1.

The second input/output (not shown) of the first semiconductor chip C-1 is electrically connected to an inner lead 2-2-2 of the lead 2-2 by the wire 21.

The lead 2-2 includes the inner lead 2-2-2 and the outer lead 2-2-1 continuous with the inner lead 2-2-2.

The inner lead 2-2-2 of the lead 2-2 is formed so as to extend in the horizontal direction in the resin 22. The inner lead 3-2-2 is provided in the upper part of the inner lead 2-2-2.

The upper surface of a contact portion of the inner lead 2-2-2 contacting an inner lead 3-2-2 is adhered to the inner lead 3-2-2, so that the upper surface is brought into contact and has electrical connection with the lower surface of the contact portion of the inner lead 3-2-2.

The outer lead 2-2-1 continuous with the inner lead 2-2-2 includes, so as to be connected to the corresponding wiring of the printed circuit board 1, a tilt portion extending in the obliquely lower left direction, and a horizontal portion continuous with this tilt portion and extending in the horizontal direction on the printed circuit board 1. The horizontal portion of this outer lead 2-2-1 is connected, with the solder S, to the wiring formed on the printed circuit board 1.

Above the first semiconductor chip C-1, a second semiconductor chip C-2 mounted on the upper surface of a second die pad 3-3 is provided in the resin 22 via the resin 22 of a predetermined interval. The lower surface (a surface different from the surface on which the second semiconductor chip C-2 is mounted) of the second die pad 3-3 is arranged to be exposed from the upper surface of the molded resin 22.

A heat sink 4 is provided on the lower surface of the second die pad 3-3. This radiates heat generated in the second semiconductor chip C-2 to the heat sink 4 via the second die pad 3-3.

The first input/output (not shown) of the second semiconductor chip C-2 is electrically connected to the inner lead 3-1-2 via the wire 21.

The inner lead 3-1-2 includes a horizontal portion extending in the horizontal direction in the resin 22, a tilt portion extending in the obliquely downward direction toward the upper surface of the contact portion of the inner lead 2-1-2, a contact portion continuous with this tilt portion, contacting the upper surface of the contact portion of the inner lead 2-1-2, and formed in the horizontal direction, and a horizontal portion continuous with this contact portion and extending in the horizontal direction and an oblique direction away from the inner lead 13-1-2 (the obliquely frontward direction in the drawing surface of FIG. 1 or the obliquely backward direction in the drawing surface of FIG. 1).

The lower surface of the contact portion of the inner lead 3-1-2 contacts and is electrically connected to the upper surface of the contact portion of the inner lead 2-1-2. The end face of one end of the horizontal portion of the inner lead 3-1-2 is exposed at the side surface of the molded resin 22.

The second input/output (not shown) of the second semiconductor chip C-2 is electrically connected to the inner lead 3-2-2 by the wire 21.

The inner lead 3-2-2 includes a horizontal portion extending in the horizontal direction in the resin 22, a tilt portion continuous with this horizontal portion and extending in the obliquely downward direction toward the upper surface of the contact portion of the inner lead 2-2-2, a contact portion continuous with this tilt portion, contacting the upper surface of the contact portion of the inner lead 2-2-2, and formed in the horizontal direction, and a horizontal portion continuous with this contact portion and extending in the horizontal direction and an oblique direction away from the inner lead 13-2-2 (the obliquely frontward direction in the drawing surface of FIG. 1 or the obliquely backward direction in the drawing surface of FIG. 1).

The lower surface of the contact portion of the inner lead 3-2-2 contacts and is electrically connected to the upper surface of the contact portion of the inner lead 2-2-2. The end face of one end of the horizontal portion of the inner lead 3-2-2 is exposed at the side surface of the molded resin 22.

For example, power or a signal from the outside of the semiconductor device D supplied to the first inputs/outputs of the first semiconductor chip C-1 and second semiconductor chip C-2 is supplied to the lead 2-1 and inner lead 3-1-2 shown in FIG. 1. For example, a signal or the like from the second input/output of the first semiconductor chip C-1 or second semiconductor chip C-2 to the outside of the semiconductor device D is supplied to the lead 2-2 and the inner lead 3-2-2.

Note that the leads 2-1 and 2-2, and the inner leads 3-1-2 and 3-2-2 can be used for signal transmission between the first semiconductor chip C-1 and the second semiconductor chip C-2.

FIG. 2 is the partial sectional view showing the relationship between the inner leads 12-1-2 and 12-2-2 and the inner leads 13-1-2 and 13-2-2 for inter-chip communication.

As shown in FIG. 2, the third input/output (not shown) of the first semiconductor chip C-1 is electrically connected to the inner lead 12-1-2 of the lead 12-1 by the wire 21.

The lead 12-1 only includes the inner lead 12-1-2 whose tie bar is cut when the semiconductor device D is manufactured and is formed so as to extend in the horizontal direction in the resin 22. The inner lead 13-1-2 of the lead 13-1 is provided in the upper part of the inner lead 12-1-2.

The inner lead 12-1-2 includes a contact portion, and the upper surface of the contact portion is adhered to the lead 13-1, so that the upper surface is brought into contact and has electrical connection with the lower surface of the contact portion of the inner lead 13-1-2 of the lead 13-1. The end face of one end of the contact portion of the inner lead 12-1-2 is exposed at the side surface of the molded resin 22.

The fourth input/output (not shown) of the first semiconductor chip C-1 is electrically connected to the inner lead 12-2-2 of the lead 12-2 by the wire 21. The lead 12-2 only includes the inner lead 12-2-2 whose tie bar is cut when the semiconductor device D is manufactured and is formed so as to extend in the horizontal direction in the resin 22. The inner lead 13-2-2 of the lead 13-2 is provided in the upper part of the inner lead 12-2-2.

The inner lead 12-2-2 includes a contact portion, and the upper surface of the contact portion is adhered to the lead 13-2, so that the upper surface is brought into contact and has electrical connection with the lower surface of the contact portion of the inner lead 13-2-2 of the lead 13-2. The end face of the contact portion of the inner lead 12-2-2 is exposed at the side surface of the molded resin 22.

The third input/output (not shown) of the second semiconductor chip C-2 is electrically connected to the inner lead 13-1-2 of the lead 13-1 by the wire 21.

The inner lead 13-1-2 includes a horizontal portion extending in the horizontal direction in the resin 22, a tilt portion continuous with this horizontal portion and extending in the obliquely lower right direction toward the upper surface of the contact portion of the inner lead 12-1-2, and a horizontal portion continuous with this tilt portion and extending in the horizontal direction.

The inner lead 13-1-2 includes a contact portion, and the lower surface of the contact portion contacts and is electrically connected to the upper surface of the contact portion of the inner lead 12-1-2. The end face of one end of the contact portion of the inner lead 13-1-2 is exposed at the side surface of the molded resin 22.

The fourth input/output (not shown) of the second semiconductor chip C-2 is electrically connected to the inner lead 13-2-2 of the lead 13-2 by the wire 21.

The inner lead 13-2-2 includes a horizontal portion extending in the horizontal direction in the resin 22, a tilt portion continuous with this horizontal portion and extending in the obliquely lower left direction toward the upper surface of the contact portion of the inner lead 12-2-2, and a horizontal portion continuous with this tilt portion and extending in the horizontal direction.

The inner lead 13-2-2 includes a contact portion, and the lower surface of the contact portion contacts and is electrically connected to the upper surface of the contact portion of the inner lead 12-2-2. The end face of one end of the contact portion of the inner lead 13-2-2 is exposed at the side surface of the molded resin 22.

The inner leads 12-1-2, 12-2-2, 13-1-2, and 13-2-2 shown in FIG. 2 are used for the signal transmission between the first semiconductor chip C-1 and the second semiconductor chip C-2.

For example, a signal from the third input/output of the first semiconductor chip C-1 to the third input/output of the second semiconductor chip C-2 is supplied to the inner leads 12-1-2 and 13-1-2. A signal from the fourth input/output of the second semiconductor chip C-2 to the fourth input/output of the first semiconductor chip C-1 is supplied to the inner leads 12-2-2 and 13-2-2.

Figure 3:
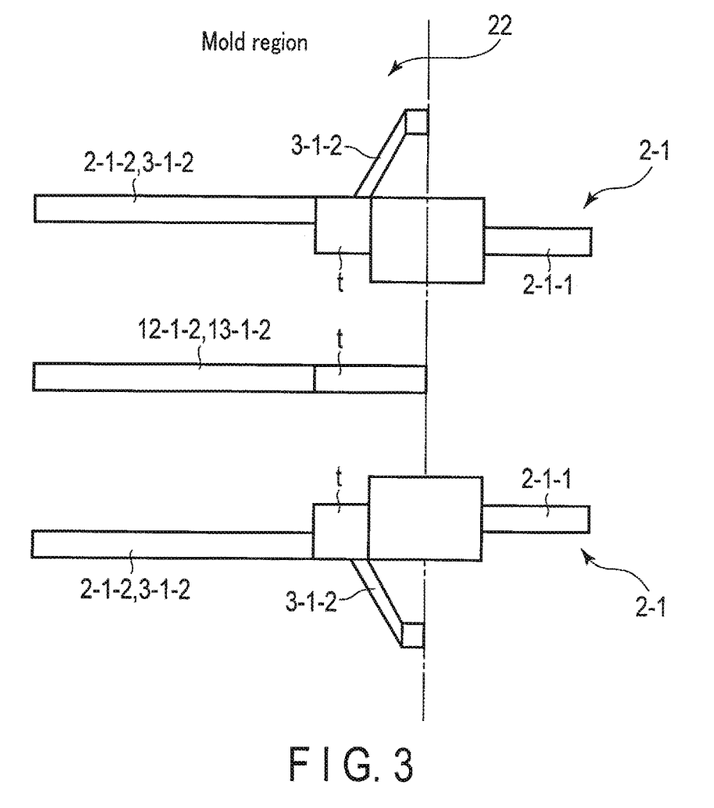
FIG. 3 is a plan view for explaining the positional relationship between the leads 2-1 and the inner leads 3-1-2, and the inner leads 12-1-2 and 13-1-2 used for the inter-chip communication.

FIG. 3 is a plan view for explaining the positional relationship between the leads 2-1 and the inner leads 3-1-2, and the inner leads 12-1-2 and 13-1-2 used for the inter-chip communication.

As shown in FIG. 3, the inner lead 12-1-2 used for the inter-chip communication is arranged between the adjacent inner leads 2-1-2. The inner lead 13-1-2 used for the inter-chip communication is arranged between the adjacent inner leads 3-1-2. The end face of one end of each of the inner leads 12-1-2 and 13-1-2 is exposed at the side surface of the molded resin 22.

The side surface of one end of each inner lead 3-1-2 in contact with a corresponding one of contact portions t of the inner lead 2-1-2 of the lead 2-1 is also exposed at the side surface of the molded resin 22.

Figure 4:
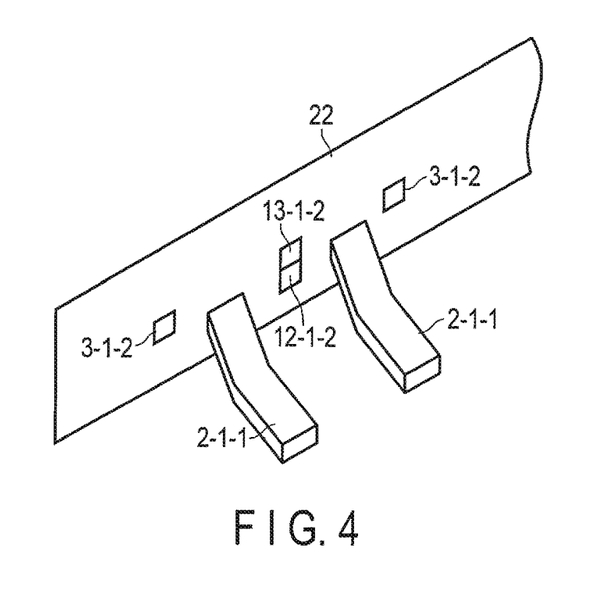
FIG. 4 is a view partially showing the side surface of a molded resin 22 of the semiconductor device D for explaining the positional relationship of outer leads 2-1-1 according to the embodiment.

FIG. 4 is a view partially showing the side surface of the molded resin 22 of the semiconductor device D for explaining the positional relationship of outer leads 2-1-1 according to the embodiment.

As shown in FIG. 4, the inner lead 12-1-2 and inner lead 13-1-2 used for the signal transmission between the first semiconductor chip C-1 and the second semiconductor chip C-2 are exposed at the side surface of the molded resin 22.

The outer lead 2-1-1 and the other outer lead 2-1-1 of the lead 2-1 are arranged on both sides, in the horizontal direction, of a mold region of these inner lead 12-1-2 and inner lead 13-1-2.

Near the outer lead 2-1-1 and the other outer lead 2-1-1, the inner lead 3-1-2 and the other inner lead 3-1-2 are, respectively, exposed at the side surface of the molded resin 22.

This allows the inner lead 12-1-2 and the inner lead 13-1-2 to externally observe the signal between the first semiconductor chip C-1 and the second semiconductor chip C-2. The inner leads 3-1-2 can externally observe signals flowing through the outer leads 2-1-1.

The leads 3-1, 3-2, 13-1, and 13-2 and the leads 2-1, 2-2, 12-1, and 12-2 are adhered to each other in a manufacturing process. In the embodiment, in order to increase the adherence accuracy of these leads 3-1, 3-2, 13-1, and 13-2 and the leads 2-1, 2-2, 12-1, and 12-2, concavo-convex portions (for example, hollows or trenches) are formed in the contact portions t of the inner leads 3-1-2, 3-2-2, 13-1-2, and 13-2-2 and the inner leads 2-1-2, 2-2-2, 12-1-2, and 12-2-2.

Figure 5:
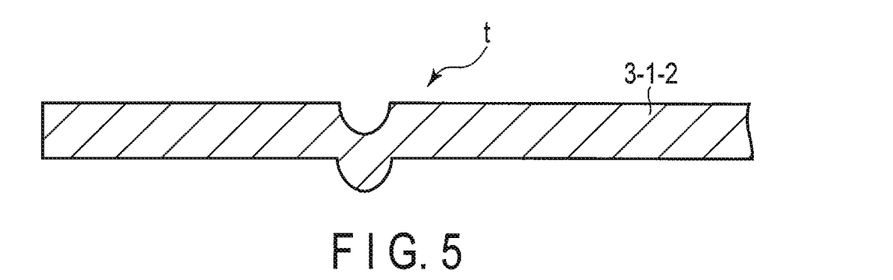
FIG. 5 is a view showing a concavo-convex portion formed in the inner lead 3-1-2 (upper frame)
Figure 6:
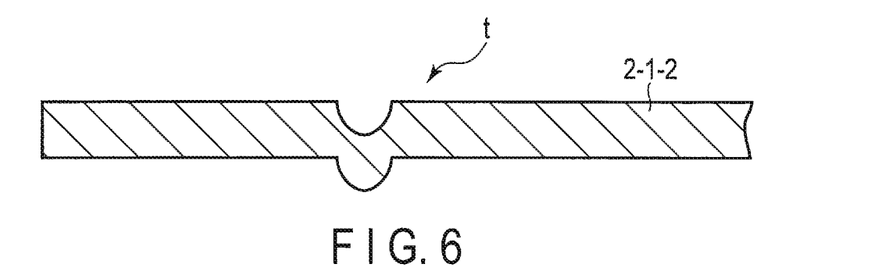
FIG. 6 is a view showing a concavo-convex portion formed in an inner lead 2-1-2 (lower frame)
Figure 7:
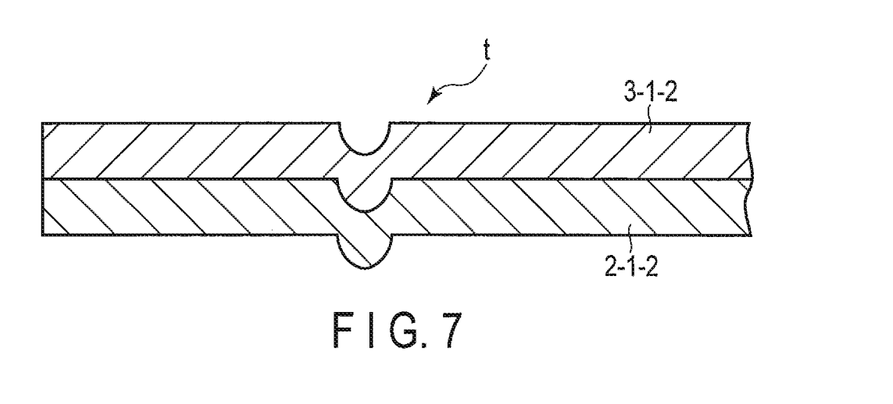
FIG. 7 is a view showing a state in which the inner lead 3-1-2 and the inner lead 2-1-2 are adhered to each other.

For example, as shown in FIGS. 5 and 6, the concavo-convex portions are provided in the inner lead 3-1-2 (upper frame) and the inner lead 2-1-2 (lower frame). FIG. 7 is a view showing a state in which the inner lead 3-1-2 and the inner lead 2-1-2 are adhered to each other.

In the embodiment, it is possible, by adhering concave portions which are formed in the inner leads 2-1-2, 2-2-2, 12-1-2, and 12-2-2 formed in one lead frame to convex portions which are formed in the inner leads 3-1-2, 3-2-2, 13-1-2, and 13-2-2 of the other lead frame, to increase the adherence accuracy of the two lead frames.

Note that a position where the concavo-convex portions are provided is not limited to the contact portion t. Further, it is possible to provide the arbitrary number of concavo-convex portions.

Furthermore, in FIGS. 1 and 2, a shape with the inner leads 2-1-2 and 2-2-2, and the inner leads 12-1-2 and 12-2-2 extending in the horizontal direction has been described. However, the present invention is not limited to such a shape.

Figure 8:
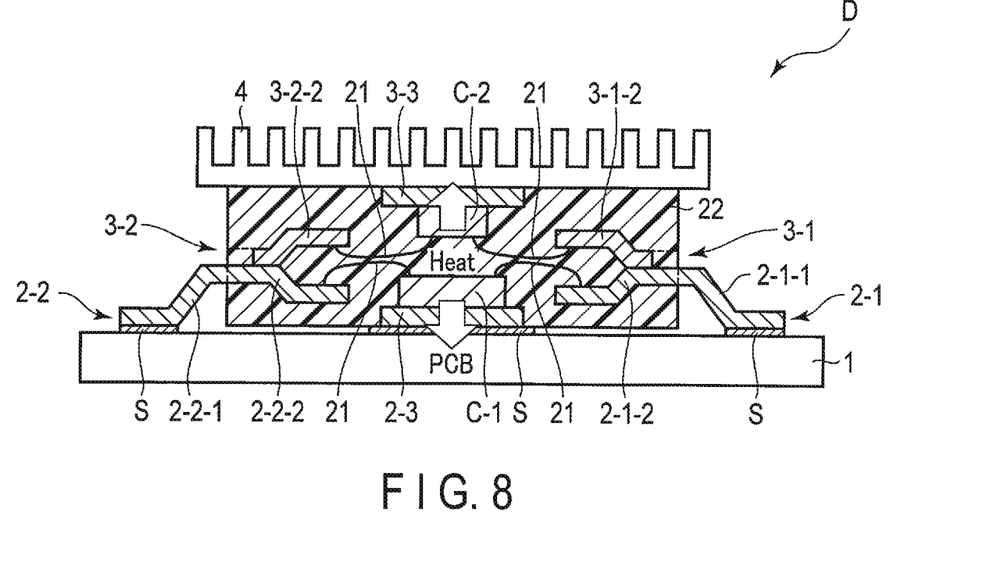
FIG. 8 is a view showing a form in which the inner lead 2-1-2 and an inner lead 2-2-2 change in the vertical direction.

FIG. 8 is a view showing a form in which the inner leads 2-1-2 and 2-2-2 change in the vertical direction. Note that the same reference numerals denote the same parts as in FIG. 1, and a description thereof will not be repeated.

As shown in FIG. 8, the inner lead 2-1-2 of the lead 2-1 is electrically connected to the first input/output (not shown) of the first semiconductor chip C-1 by the wire 21.

The inner lead 2-1-2 includes a horizontal portion connected to the first input/output of the first semiconductor chip C-1 and extending in the horizontal direction in the resin 22, a tilt portion continuous with this horizontal portion and extending in the obliquely upward direction toward the lower surface of the contact portion of the inner lead 3-1-2, and a contact portion continuous with this tilt portion, contacting the lower surface of the contact portion of the inner lead 3-1-2, and formed in the horizontal direction.

The inner lead 2-2-2 includes a horizontal portion connected to the second input/output of the first semiconductor chip C-1 and extending in the horizontal direction in the resin 22, a tilt portion continuous with this horizontal portion and extending in the obliquely upward direction toward the lower surface of the contact portion of the inner lead 3-2-2, and a contact portion continuous with this tilt portion, contacting the lower surface of the contact portion of the inner lead 3-2-2, and formed in the horizontal direction.

Figure 9:
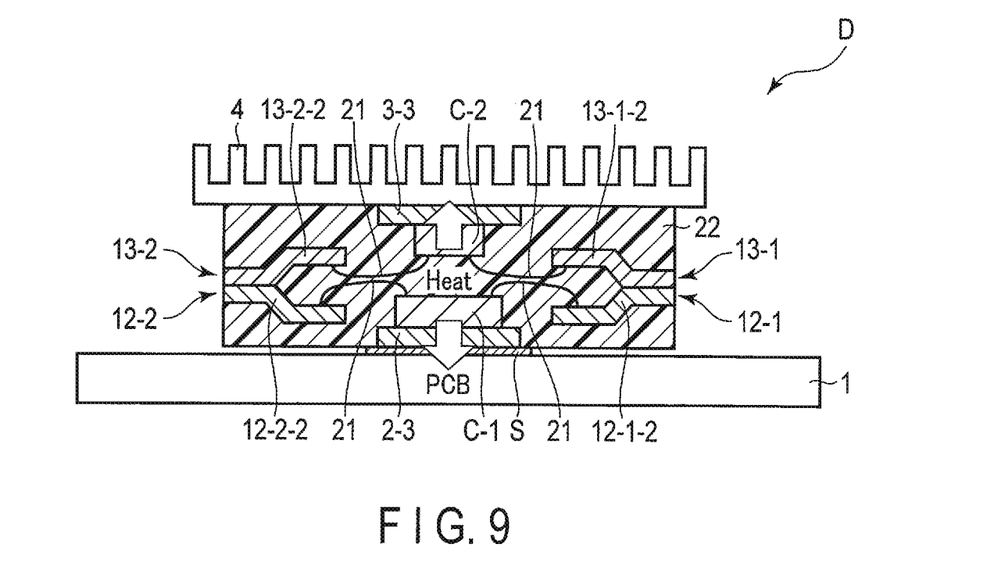
FIG. 9 is a view showing a form in which the inner leads 12-1-2 and 12-2-2 change in the vertical direction.

FIG. 9 is a view showing a form in which the inner leads 12-1-2 and 12-2-2 change in the vertical direction. Note that the same reference numerals denote the same parts as in FIG. 2, and a description thereof will not be repeated.

As shown in FIG. 9, the inner lead 12-1-2 of the lead 12-1 is electrically connected to the third input/output (not shown) of the first semiconductor chip C-1 by the wire 21.

The inner lead 12-1-2 includes a horizontal portion connected to the third input/output of the first semiconductor chip C-1 and extending in the horizontal direction in the resin 22, a tilt portion continuous with this horizontal portion and extending in the obliquely upper right direction toward the lower surface of the contact portion of the inner lead 13-1-2, and a contact portion continuous with this tilt portion, contacting the lower surface of the contact portion of the inner lead 13-1-2, and formed in the horizontal direction.

The inner lead 12-2-2 includes a horizontal portion connected to the fourth input/output of the first semiconductor chip C-1 and extending in the horizontal direction in the resin 22, a tilt portion continuous with this horizontal portion and extending in the obliquely upper left direction toward the lower surface of the contact portion of the inner lead 13-2-2, and a contact portion continuous with this tilt portion, contacting the lower surface of the contact portion of the inner lead 13-2-2, and formed in the horizontal direction.

2 Method of Manufacturing Semiconductor Device

A semiconductor manufacturing method of the semiconductor device by a semiconductor manufacturing apparatus according to the embodiment will be described below.

Figure 10:
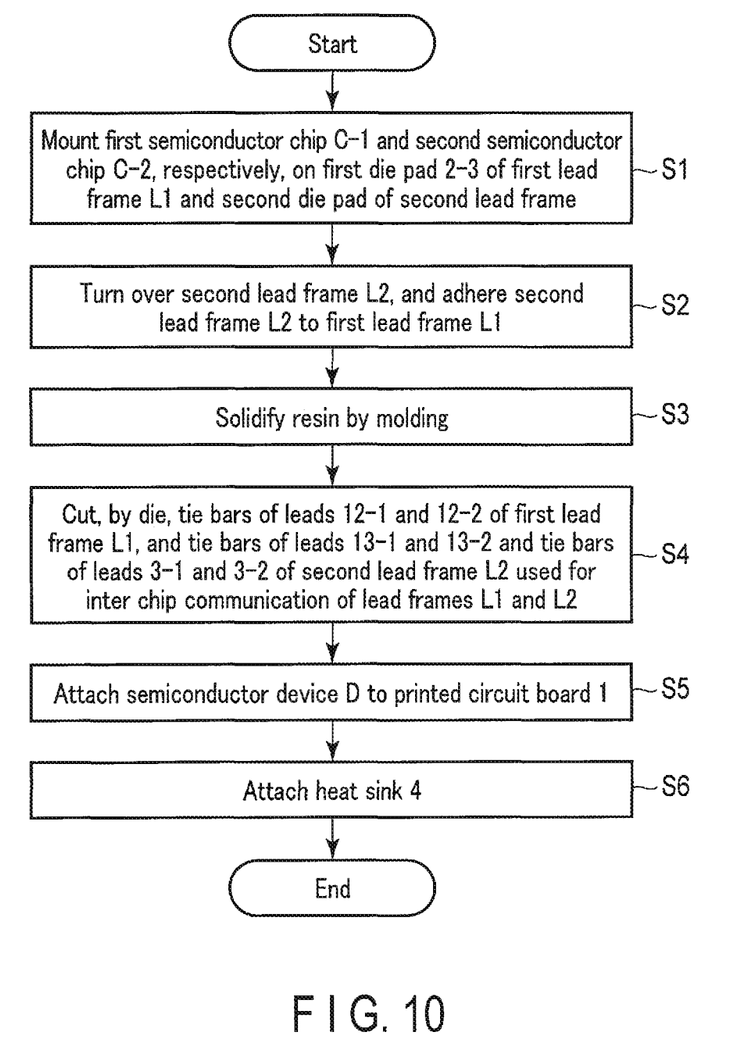
FIG. 10 is a flowchart for explaining a method of manufacturing the semiconductor device according to the embodiment.

FIG. 10 is a flowchart for explaining a method of manufacturing the semiconductor device according to the embodiment.

Figure 11:
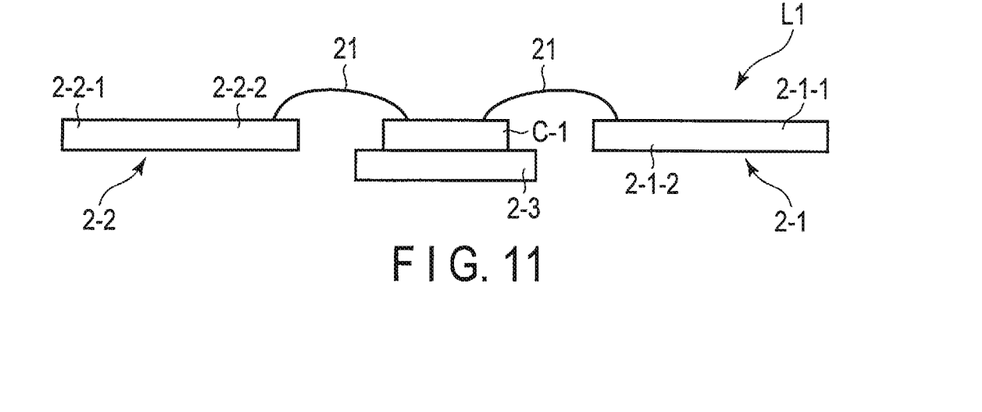
FIG. 11 is a view showing a first lead frame L1 with a first semiconductor chip C-1 mounted on a first die pad 2-3.
Figure 12:
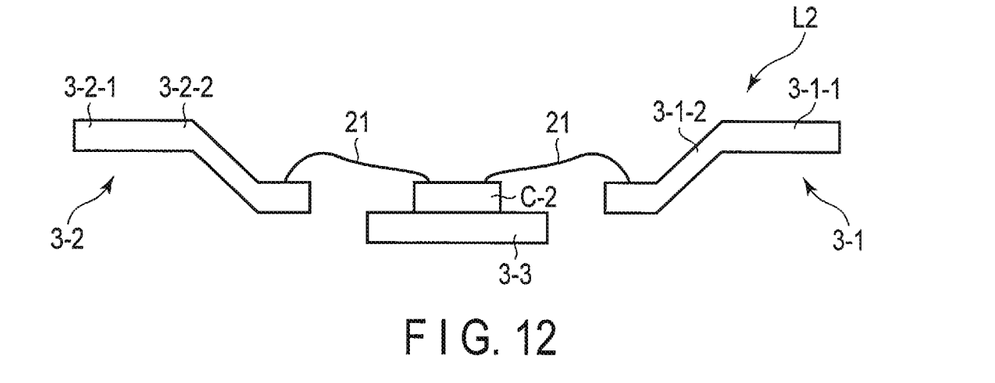
FIG. 12 is a view showing a second lead frame L2 with a second semiconductor chip C-2 mounted on a second die pad 3-3.

First, the first semiconductor chip C-1 and the second semiconductor chip C-2 are, respectively, mounted on the first die pad 2-3 of the first lead frame L1 and the second die pad 3-3 of the second lead frame L2 (step S1 of FIG. 10, and FIGS. 11 and 12).

Note that in FIG. 11, only the leads 2-1 and 2-2, and first die pad 2-3 formed in the first lead frame L1 are shown for the sake of descriptive simplicity. However, the leads 12-1 and 12-2, and the other leads are also formed in the lead frame L1. In FIG. 11, reference numerals 2-1-2 and 2-1-1 of the lead 2-1 denote the inner lead and the outer lead, and reference numerals 2-2-2 and 2-2-1 of the lead 2-2 denote the inner lead and the outer lead.

Likewise, in FIG. 12, only the inner leads 3-1-2 and 3-2-2 which, respectively, include the tie bars 3-1-1 and 3-2-1 formed in the second lead frame L2 are shown for the sake of descriptive simplicity. However, the leads 13-1 and 13-2, and the other leads are also formed in the lead frame L2.

Figure 14:
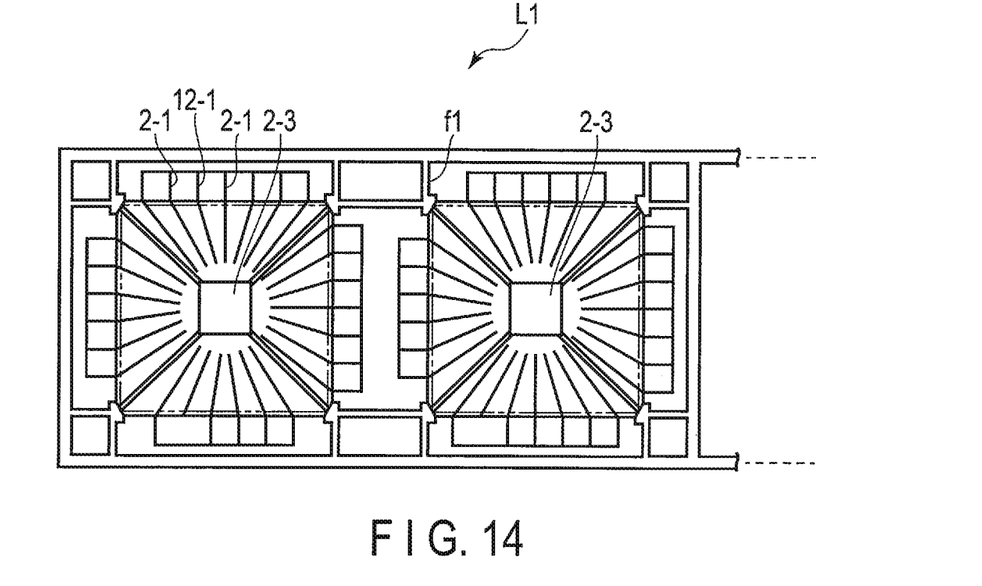
FIG. 14 is a view for explaining an example of the lead frame L1.

FIG. 14 is a view for explaining an example of the lead frame L1.

As shown in FIG. 14, the lead frame L1 has a rectangular shape, and the plurality of first die pads 2-3 each mounting the first semiconductor chip C-1 are formed in a frame f1 of the lead frame L1. A plurality of leads which include the leads 2-1 and 12-1 connected to a corresponding input/output of the first semiconductor chip C-1 mounted on the first die pad 2-3 are also formed.

Figure 15:
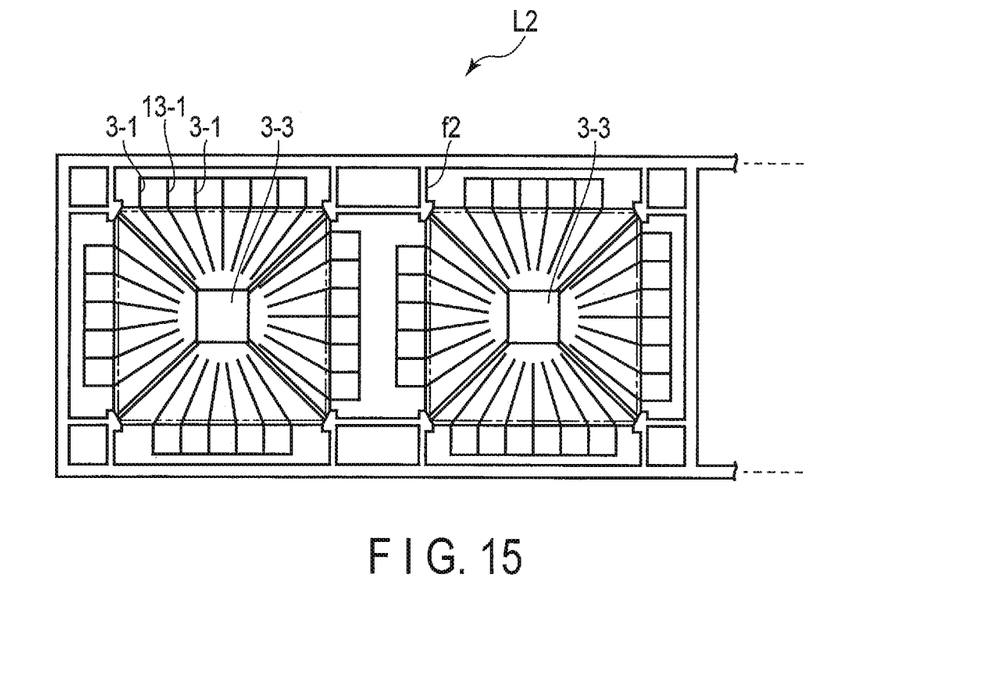
FIG. 15 is a view for explaining an example of the lead frame L2.

FIG. 15 is a view for explaining an example of the lead frame L2.

As shown in FIG. 15, the lead frame L2 has a rectangular shape, and the plurality of first die pads 3-3 each mounting the second semiconductor chip C-2 are formed in a frame f2 of the lead frame L2. A plurality of leads which include the inner leads 3-1-2 and 13-1-2 connected to a corresponding input/output of the second semiconductor chip C-2 mounted on the second die pad 3-3 are also formed.

Figure 13:
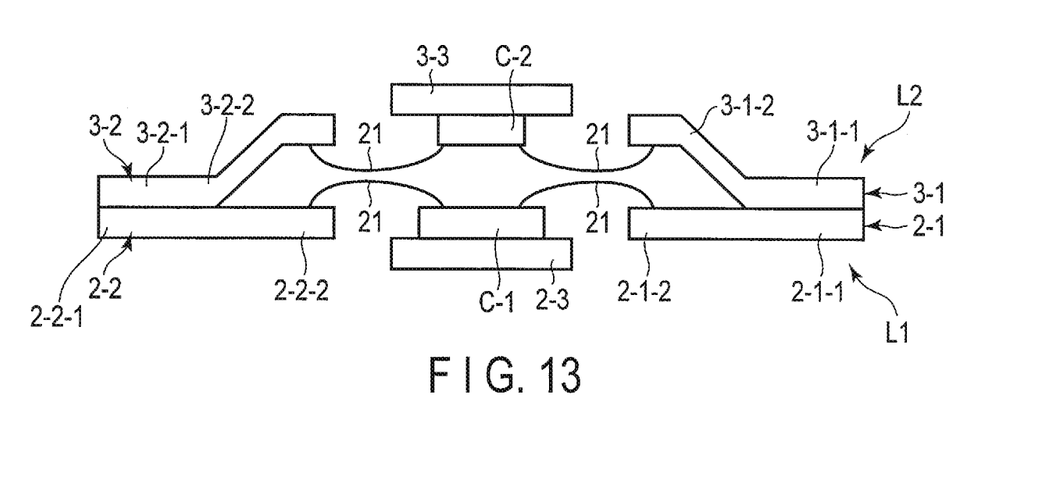
FIG. 13 is a view showing a state in which the second lead frame L2 is adhered to the first lead frame L1.

Then, the second lead frame L2 is turned over, and adhered to the first lead frame L1 such that the first semiconductor chip C-1 and the second semiconductor chip C-2 face each other at a predetermined interval (step S2 of FIG. 10: FIG. 13).

Adherence positioning of the lead frames L1 and L2 is performed so as to match the concave portion with the convex portion provided in the contact portion t, as shown in FIG. 5, FIG. 6, and FIG. 7. This makes it possible to increase the adherence accuracy of the lead frames L1 and L2.

Figure 16:
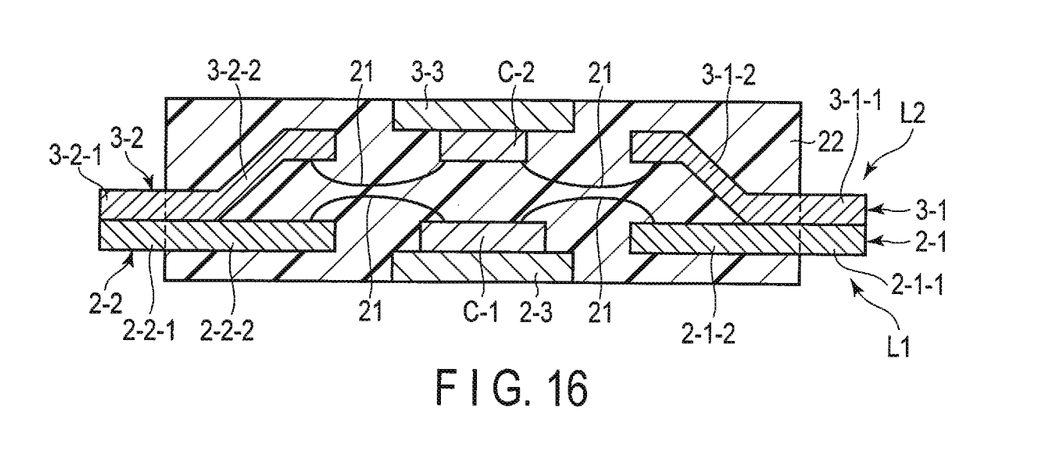
FIG. 16 is a view showing the lead frames L1 and L2 that are fixed with the molded resin 22.

Then, the resin 22 is fixed by molding (step S3 of FIG. 10: FIG. 16). That is, the first semiconductor chip C-1, the second semiconductor chip C-2, the first die pad 2-3, the second die pad 3-3, the inner leads (2-1-2, 3-1-2, 2-2-2, 3-2-2-, 12-1-2, 13-1-2, 12-2-2, and 13-2-2) of the lead frames L1 and L2, and the like are fixed with the resin 22.

At this time, the resin 22 is fixed such that the lower surfaces of the first die pad 2-3 and second die pad 3-3 are exposed from the resin 22. However, the lower surfaces of the first die pad 2-3 and second die pad 3-3 may be exposed by polishing after the resin is solidified.

Figure 17:
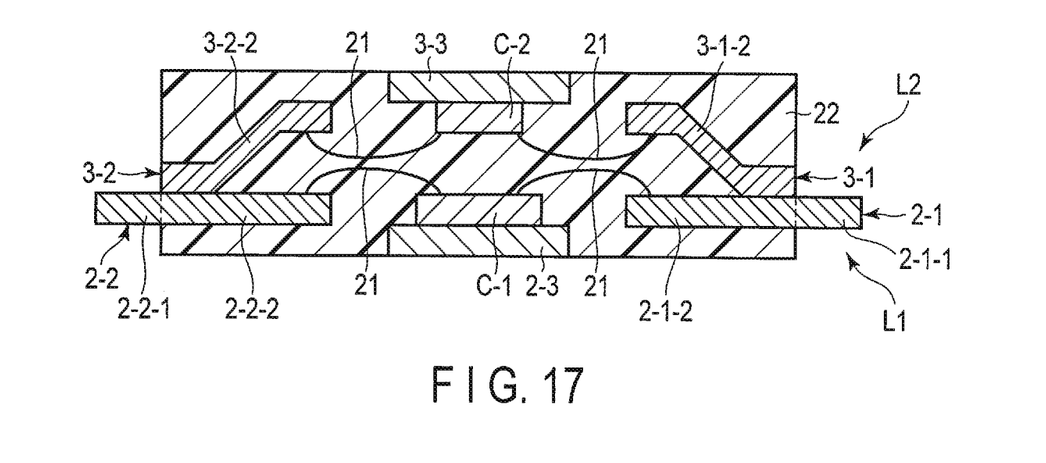
FIG. 17 is a view showing a state in which tie bars 3-1-1 and 3-2-1 of the second lead frame L2 are cut by a die.
Figure 18:
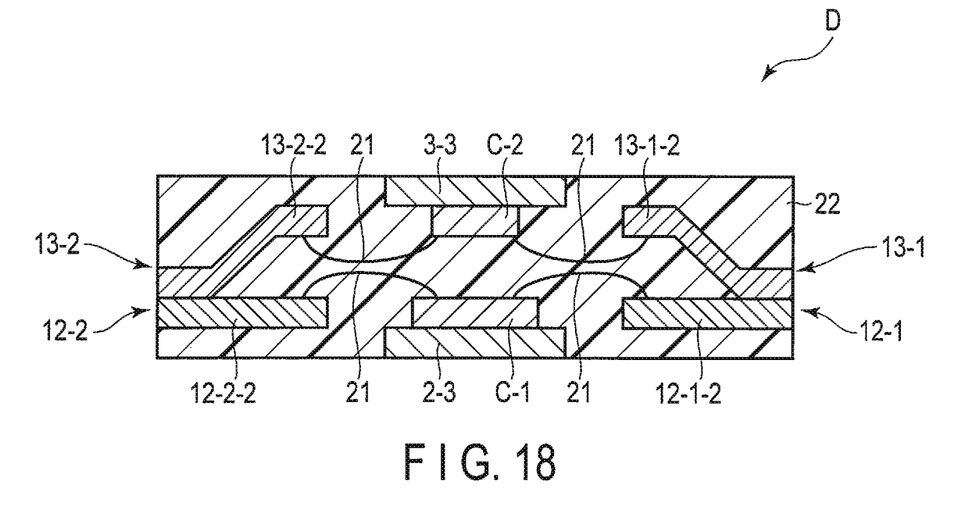
FIG. 18 is a view showing leads 12-1, 12-2, 13-1, and 13-2 used for inter-chip communication with the tie bars of the lead frames L1 and L2 being cut by the die.

Then, tie bars 12-1-1 and 12-2-1 of the leads 12-1 and 12-2 of the first lead frame L1, and tie bars 13-1-1 and 13-2-1 of the leads 13-1 and 13-2 and the tie bars 3-1-1 and 3-2-1 of the leads 3-1 and 3-2 of the second lead frame L2 used for inter-chip communication of the lead frames L1 and L2 are cut by a die (step S4 of FIG. 10: FIGS. 17 and 18).

At this time, the tie bars 12-1-1, 12-2-1, 13-1-1, and 13-2-1 of the leads 12-1, 12-2, 13-1, and 13-2 are cut together with cutting of the tie bars 3-1-1 and 3-2-1 of the leads 3-1 and 3-2.

Figure 19:
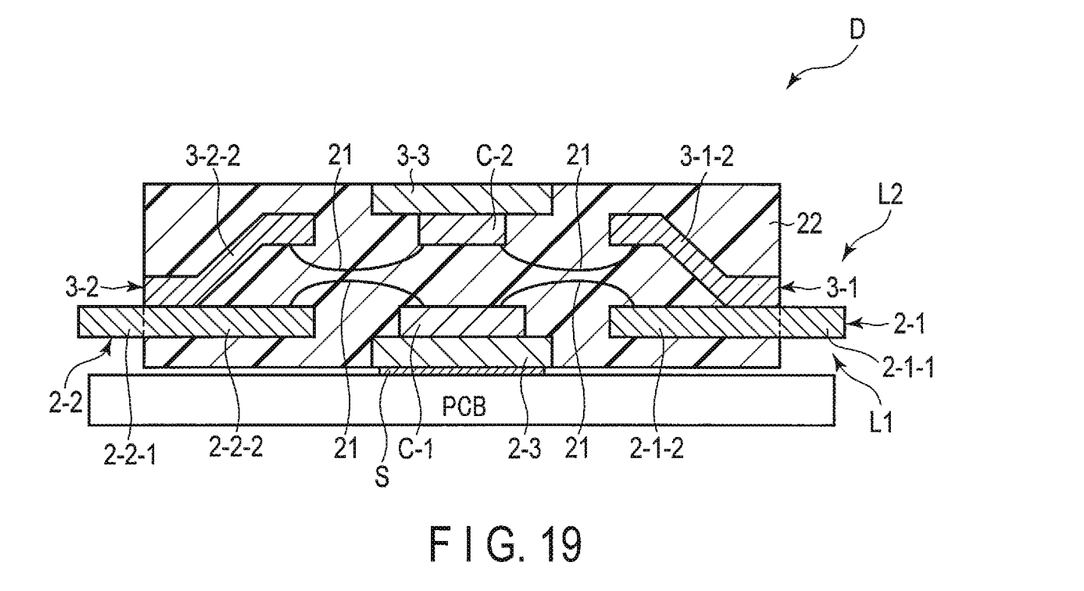
FIG. 19 is a view showing a state in which the semiconductor device D is attached to a printed circuit board 1.
Figure 20:
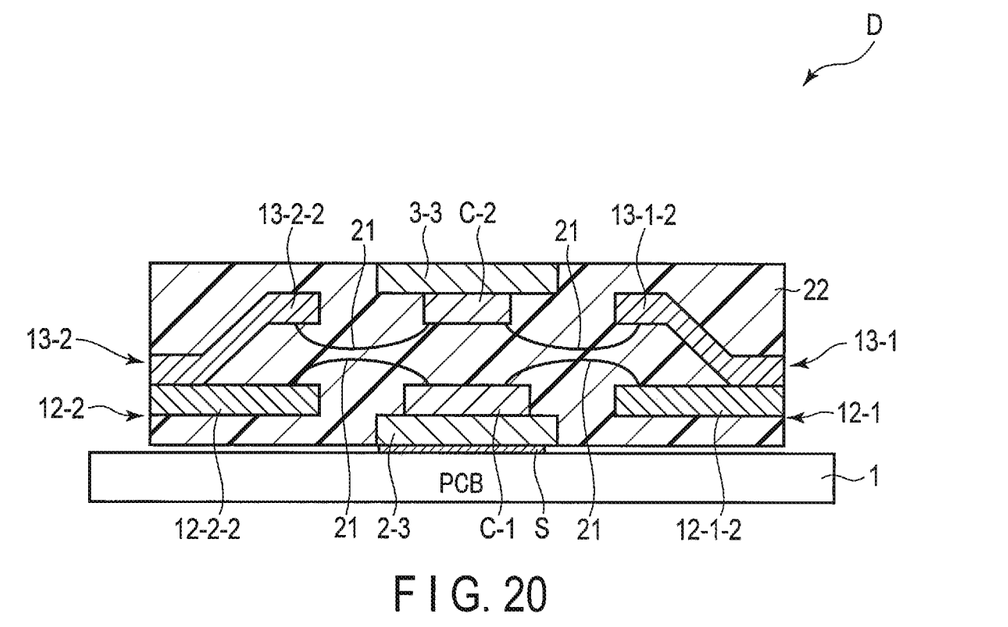
FIG. 20 is a view showing a state in which the semiconductor device D is attached to the printed circuit board 1.

Subsequently, the semiconductor device D is attached to the printed circuit board 1 with the solder S (step S5 of FIG. 10: FIGS. 19 and 20). At this time, the outer leads 2-1-1 and 2-2-1 of the semiconductor device D are connected, with the solder S, to corresponding wirings of the printed circuit board 1 (not shown). Also, the lower surface of the first semiconductor chip C-1 is also fixed, with the solder S, to the printed circuit board 1 (FIGS. 19 and 20).

Then, the heat sink 4 is attached to the bottom surface of the second die pad 3-3 on which the second semiconductor chip C-2 is mounted, the bottom surface being exposed from the resin 22 (step S6 of FIG. 10: FIGS. 1 and 2).

Adherence of the lead frames of the semiconductor device D will now be described. The forms in which the inner leads 2-1-2, 2-2-2, 12-1-2, and 12-2-2 change in the vertical direction shown in FIGS. 8 and 9 will be described here.

Figure 21:
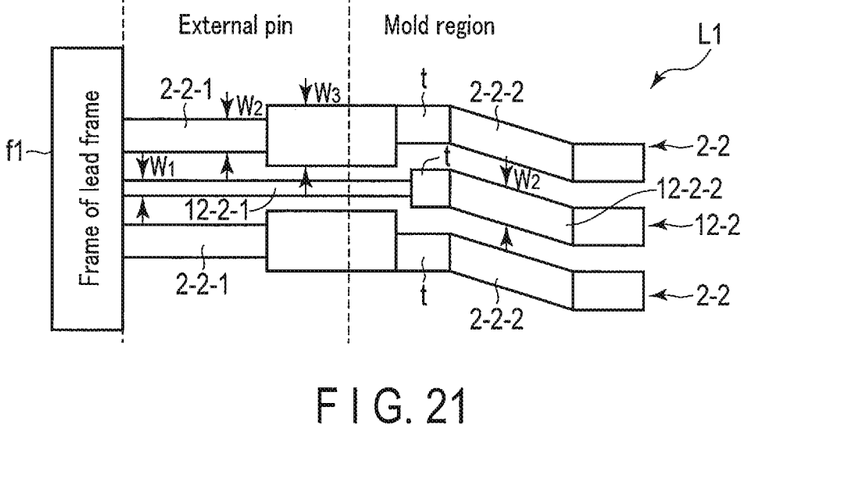
FIG. 21 is a view partially showing the first lead frame L1.

FIG. 21 is a view partially showing the first lead frame L1. The plurality of leads 2-2 and the lead 12-2 used for inter-chip communication are provided in the frame f1 of the lead frame L1.

The lead 12-2 is provided between the adjacent leads 2-2 and includes the first horizontal portion having a width w1 and extending in the horizontal direction, the contact portion t continuous with this first horizontal portion and having a width w2 in contact with the lower surface of the contact portion t of the lead 13-2 of the lead frame L2, a tilt portion continuous with the contact portion t, having the width w2, and extending in the obliquely downward direction, and the second horizontal portion continuous with the tilt portion and extending in the horizontal direction.

The leads 2-2 are provided on both sides in a direction perpendicular to the elongated direction of the lead 12-2. Each lead 2-2 includes the first horizontal portion having the width w2 and extending in the horizontal direction, the second horizontal portion continuous with the first horizontal portion, having a width w3, and extending in the horizontal direction, the contact portion t continuous with the second horizontal portion and having the width w2 in contact with the lower surface of the contact portion t of the lead frame L2, a tilt portion continuous with the contact portion t, having the width w2, and extending in the obliquely downward direction, and the second horizontal portion continuous with the tilt portion and extending in the horizontal direction.

Note that there are relations w$1$<w$2$ and w$1$<w$3$. This makes it possible to save the space which the inner leads 12-2-2 and 13-2-2 used for inter-chip communication occupy in the semiconductor device D.

Figure 22:
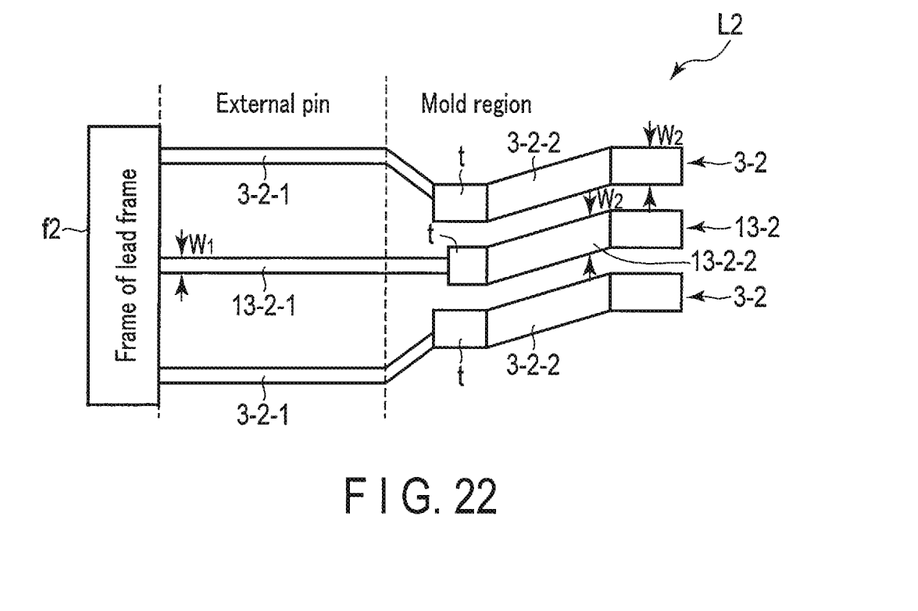
FIG. 22 is a view partially showing the second lead frame L2.

FIG. 22 is a view partially showing the second lead frame L2. The plurality of tie bars 3-2-1 and 13-2-1 are provided in the frame f2 of the lead frame L2.

The inner lead 13-2-2 is provided between the adjacent inner leads 3-2-2 and includes the first horizontal portion having the width w1 and extending in the horizontal direction, the contact portion t continuous with this first horizontal portion and having the width w2 in contact with the upper surface of the contact portion t of the lead 12-2 of the lead frame L1, a tilt portion continuous with the contact portion t, having the width w2, and extending in the obliquely upward direction, and the second horizontal portion continuous with the tilt portion and extending in the horizontal direction.

The inner leads 3-2-2 are provided on both sides in a direction perpendicular to the elongated direction of the inner lead 13-2-2. Each inner lead 3-2-2 includes the first horizontal portion having the width w1 and extending in the horizontal direction, the first tilt portion continuous with the first horizontal portion, having the width w1, and extending in the horizontal direction and an oblique direction toward the contact portion t of the lead 13-2, the contact portion t continuous with the first tilt portion and having the width w2 in contact with the upper surface of the contact portion t of the lead frame L1, the second tilt portion continuous with the contact portion t, having the width w2, and extending in the obliquely upward direction, and the second horizontal portion continuous with the second tilt portion and extending in the horizontal direction.

Figure 23:
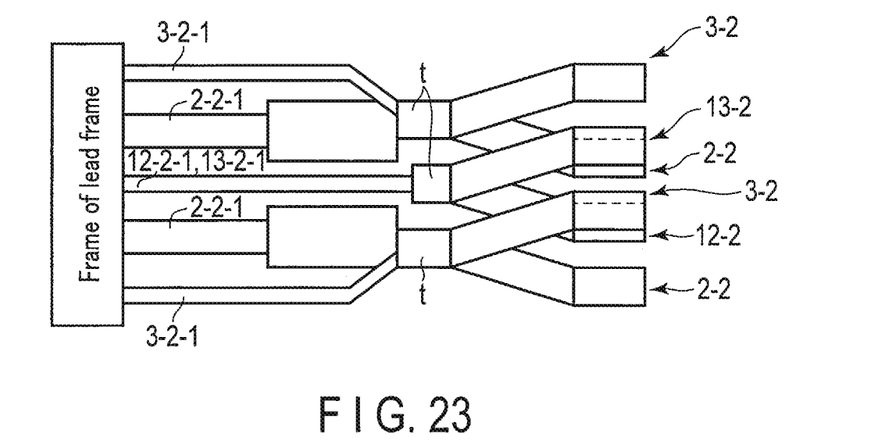
FIG. 23 is a view for explaining a state in which the lead frame L1 shown in FIG. 21 and the lead frame L2 shown in FIG. 22 are adhered to each other.
Figure 24:
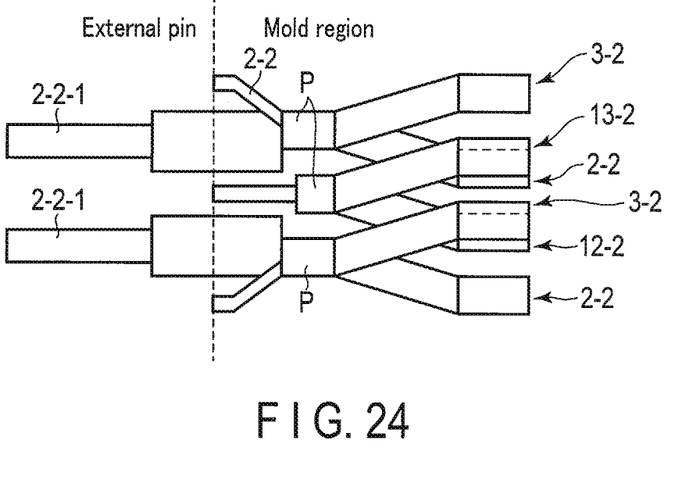
FIG. 24 is a view showing the state of inner leads 3-2-2, 12-2-2, and 13-2-2 with tie bars 3-2-1, 12-2-1, and 13-2-1 being cut.

FIG. 23 is a view for explaining a state in which the lead frame L1 shown in FIG. 21 and the lead frame L2 shown in FIG. 22 are adhered to each other. FIG. 24 is a view showing the state of the inner leads 3-2-2, 12-2-2, and 13-2-2 with the tie bars 3-2-1, 12-2-1, and 13-2-1 being cut after the resin 22 is fixed by molding.

3 Effects

According to the embodiment, as for a lead used for inter-chip communication, it is possible to reduce a package size by the amount of a reduction in unwanted outer lead.

It is possible, by adopting a structure in which two lead frames L1 and L2 are adhered to each other, to expose the first die pad 2-3 and the second die pad 3-3 at the two surfaces of a package. It is therefore possible to secure radiation paths on the two surfaces of the semiconductor device D and to suppress interference of heat between chips.

It is also possible, by adopting the structure in which two lead frames L1 and L2 are adhered to each other, to improve the adherence accuracy of the lead frames as compared with a case in which a semiconductor device is manufactured by simply bending a lead frame.

A fluctuation in local stress applied to semiconductor chips does not occur because of a structure without stacking the semiconductor chips, making it further possible to decide the layout of circuits on the semiconductor chips without imposing any constraint. That is, according to the semiconductor device of the embodiment, a semiconductor chip surface is uniformly joined to the molded resin 22, making it possible to reduce the gradient of the level of a stress applied to the semiconductor chip surface.

Some embodiments of the present invention have been described above. However, these embodiments are presented merely as examples and are not intended to limit the scope of the invention. These novel embodiments can be carried out in various other forms, and various omissions, replacements, and changes can be made without departing from the spirit of the invention. The embodiments and their modifications are also incorporated in the scope and the spirit of the invention as well as in the invention described in the claims and their equivalents.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method of manufacturing a semiconductor device, the method comprising:
   mounting a first semiconductor chip on a first die pad of a first lead frame which includes the first die pad, a first inner lead, and a first tie bar extending from the first inner lead;
   mounting a second semiconductor chip on a second die pad of a second lead frame which includes the second die pad, a second inner lead, and a second tie bar extending from the second inner lead;
   adhering the first inner lead and the second inner lead to each other such that the first semiconductor chip and the second semiconductor chip face each other at a predetermined interval;
   covering, with a resin, the first die pad, the second die pad, the first inner lead, the second inner lead, the first semiconductor chip, and the second semiconductor chip; and
   cutting the first tie bar from the first inner lead covered with the resin, and cutting the second tie bar from the second inner lead covered with the resin,
   wherein the first lead frame further includes a third inner lead electrically connected to the first semiconductor chip and an outer lead extending from the third inner lead, the second lead frame further includes a fourth inner lead electrically connected to the second semiconductor chip and a third tie bar extending from the fourth inner lead, and the cutting the first tie bar and the second tie bar are performed together with cutting of the third tie bar.

2. The method according to claim 1, wherein the adhering the first inner lead and the second inner lead is performed using one of a positioning concave portion and convex portion formed in the first inner lead and the second inner lead.

3. The method according to claim 1, wherein the adhering the first inner lead and the second inner lead is performed using one of a positioning concave portion and convex portion formed in the third inner lead and the fourth inner lead.

* * * * *